US008889540B2

(12) United States Patent
Basker et al.

(10) Patent No.: US 8,889,540 B2
(45) Date of Patent: Nov. 18, 2014

(54) STRESS MEMORIZATION IN RMG FINFETS (71) Applicant: International Business Machines Corporation, Armonk, NY (US)

(72) Inventors: Veeraraghavan S. Basker, Schenectady, NY (US); Qing Liu, Guilderland, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/778,314

(22) Filed: Feb. 27, 2013

(65) Prior Publication Data

US 2014/0239415 A1 Aug. 28, 2014

(51) Int. Cl.
*H01L 21/3205* (2006.01)
*H01L 21/4763* (2006.01)
*H01L 29/66* (2006.01)
*H01L 21/8238* (2006.01)
*H01L 29/78* (2006.01)

(52) U.S. Cl.
CPC ...... *H01L 29/7843* (2013.01); *H01L 29/66477* (2013.01); *H01L 21/8238* (2013.01)
USPC ........... 438/591; 257/369; 257/335; 257/368; 438/369; 438/285; 438/151

(58) Field of Classification Search
CPC ................. H01L 29/66545; H01L 29/66795; H01L 27/0886; H01L 21/02532; H01L 21/823431; H01L 29/7847; H01L 29/7849
USPC ............ 257/335, 369, 368, 66, 407; 438/151, 438/285, 369, 591
See application file for complete search history.

(56) References Cited

U.S. PATENT DOCUMENTS

| 6,936,516 B1 | 8/2005 | Goo et al. |
| 7,078,299 B2 | 7/2006 | Maszara et al. |
| 8,288,296 B2 * | 10/2012 | Wong et al. ............ 438/785 |
| 2006/0022277 A1 | 2/2006 | Kavalieros et al. |

(Continued)

OTHER PUBLICATIONS

James, D. "High-K/Metal Gates in Leading Edge Silicon Devices" 23rd Annual SEMI Advanced Semiconductor Manufacturing Conference (ASMC). May 2012. pp. 346-353.

(Continued)

*Primary Examiner* — Matthew Reames
*Assistant Examiner* — Vincent Wall
(74) *Attorney, Agent, or Firm* — Tutunjian & Bitetto, P.C.; Vazken Alexanian (57) ABSTRACT Transistors with memorized stress and methods for making such transistors. The methods include forming a transistor structure having a channel region, a source and drain region, and a gate dielectric; depositing a stressor over the channel region of the transistor structure, wherein the stressor provides a stress to the channel region; removing the stressor metal after the stress is memorized within the channel region; and depositing a work function metal over the channel region of the transistor structure, where the work function metal applies less stress to the channel region than the stress applied by the stressor. A transistor with memorized stress includes a source and drain region on a substrate; a stress-memorized channel region on the substrate that retains an externally applied stress; and a gate structure including a work function gate metal that applies less stress to the stress-memorized channel region than the externally applied stress.

8 Claims, 6 Drawing Sheets

(56) References Cited

U.S. PATENT DOCUMENTS

| | | | |
|---|---|---|---|
| 2009/0072312 A1 | 3/2009 | Chang et al. | |
| 2009/0321836 A1 | 12/2009 | Wei et al. | |
| 2010/0127336 A1* | 5/2010 | Chambers et al. | 257/369 |
| 2011/0269278 A1 | 11/2011 | Hoentschel et al. | |
| 2011/0278676 A1 | 11/2011 | Cheng et al. | |
| 2011/0298061 A1 | 12/2011 | Siddiqui et al. | |
| 2013/0264639 A1* | 10/2013 | Glass et al. | 257/335 |

OTHER PUBLICATIONS

Khakifirooz, A., et al. "Strain Engineering for Fully-Depleted SOI Devices" ECS Transactions, vol. 33, Issue 6. Oct. 2010. pp. 289-499.

Pandey, S., et al. "Mechanism of Stress Memorization Technique (SMT) and Method to Maximize Its Effect" IEEE Electron Device Letters, vol. 32, No. 4. Apr. 2011. pp. 467-469.

\* cited by examiner

STRESS MEMORIZATION IN RMG FINFETS

BACKGROUND

1. Technical Field

The present invention relates to semiconductor devices and, more particularly, to stress memorization in replacement metal gate transistors.

2. Description of the Related Art

Conventional transistors are formed with polysilicon gate material. Polysilicon has been used due to its thermal resistive properties. Polysilicon's robustness during high temperature processing allows it to be annealed at high temperatures, along with source and drain regions. Furthermore, its ability to block the ion implantation into a channel region is advantageous. However, polysilicon gates have certain disadvantages. For example, polysilicon gate electrodes are formed from semiconductor materials that suffer from higher resistances than most metals. Therefore, polysilicon gate electrodes operate at lower speeds than gates made of metallic materials.

To address this problem, replacement metal gate (RMG) transistors are used. Metal gates have much lower resistances, allowing for higher gate currents and faster switching.

SUMMARY

A method for forming a transistor with memorized stress is provided. The method includes forming a transistor structure having a channel region, a source and drain region, and a gate dielectric; depositing a stressor metal over the channel region of the transistor structure, wherein the stressor metal provides a stress to the channel region; removing the stressor metal after the stress is memorized within the channel region; and depositing a work function metal over the channel region of the transistor structure, where the work function metal applies less stress to the channel region than the stress applied by the stressor metal.

A method for forming transistors with memorized stress is provided. The method includes forming a first transistor and a second transistor structure, each having a channel region, a source and drain region, and a gate dielectric; depositing a stressor metal over the channel regions of the first and second transistor structures, wherein the stressor metal provides a stress to the channel regions; masking the second transistor structure; removing the stressor metal from the first transistor structure after the stress is memorized within the channel region of the first transistor structure; removing the mask from the second transistor structure; and depositing a work function metal over the channel region of the first and second transistor structures, where the work function metal applies less stress to the channel region than the stress applied by the stressor metal.

A transistor is provided that includes a source and drain region formed on a substrate; a stress-memorized channel region on the substrate that retains an externally applied stress; and a gate structure including a work function gate metal that applies less stress to the stress-memorized channel region than the externally applied stress.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Embodiments of the present invention provide strain in a replacement metal gate (RMG) fin field effect transistor (FinFET). Creating a channel strain in a FinFET enhances carrier mobility, thereby increasing the transistor drive current. However, metals that are most effective at producing strain are not necessarily the best metals to use as a gate material, as they often have a higher than desired work function. This in turn increases the threshold voltage of the transistor. The use of a stressor metal may also adversely affect the inversion oxide thickness.

To address this problem, embodiments of the present invention use a sacrificial stress metal to create a stress in the transistor. The stress produced by the metal is memorized in the materials, such that the stress in the transistor is maintained even after the sacrificial stress metal is removed. It should be noted that no annealing is needed to bring this stress memorization about. A permanent metal with a low work function is then used to function as the actual gate and complete the transistor. It should be noted that this is of particular use with n-type FETs, as the metals used to stress p-type FETs have a suitable work function and may function as a gate metal. Embodiments of the present invention may nonetheless be implemented using p-type FETs.

Stress memorization may be accomplished using stressor materials that exhibit compressive stress. For example, titanium nitride exhibits compressive stress such that it has a tendency to shrink in volume. By depositing a layer of a compressive stressor inside a gate area and along a channel, the stressor will effectively "pull" on the surrounding materials as it compresses, causing strain within those surrounding materials. This effectively causes the surrounding material to expand, as the system itself has to balance the total stress from the materials nearby (e.g., a spacer, doped silicon, and oxides). When the stressor material is removed, roughly half of the stress is relaxed immediately, while the remaining stress remains. Contrary to a material that applies an outward stress on neighboring materials, the pull of a compressive material causes structural changes in the surrounding materials that remain even after the stressor material is removed.

Figure 1:
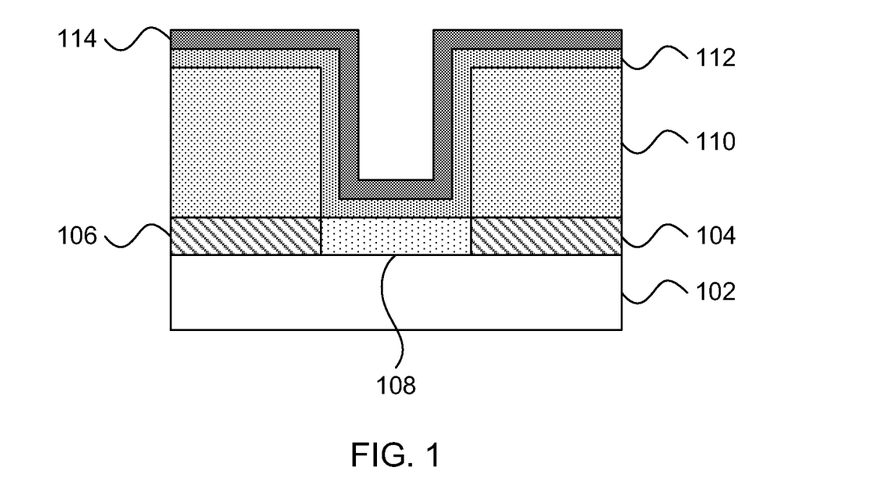
FIG. 1 is a cross-sectional view of a step in creating a memorized-stress replacement metal gate (RMG) fin field effect transistor (FinFET) in accordance with the present principles.

Referring now to the drawings in which like numerals represent the same or similar elements and initially to FIG. 1, a step in creating a memorized-stress RMG FinFET is shown. A substrate 102 may be formed from a bulk semiconductor or may be a semiconductor-on-insulator (SOI) structure. For example, the substrate may be formed from silicon, silicon dioxide, or any other suitable material. Source and drain regions 104 and 106 are formed on the substrate 102 with a channel 108 between them. The source and drain regions 104 and 106 may be formed with appropriately doped semiconductors, while the channel region 108 may be formed from an undoped semiconductor or may be doped according to the same type of dopant as the source and drain regions 104 and 106. It will be recognized by those having ordinary skill in the art that there are many possible doping combinations of the source, drain, and channel regions 104, 106, and 108, and those having such skill will be able to select appropriate materials. By way of example, the semiconductor material may be formed from, e.g., silicon, germanium, or a binary compound semiconductor, such as gallium arsenide. Exemplary dopants include phosphorus, arsenic, and boron.

An inter-layer dielectric (ILD) 110 having a thickness of, e.g., about 80 nm, is formed over the source and drain regions 104 and 106. The ILD 110 may be formed from any appropriate dielectric, though a low-k dielectric, having a dielectric constant lower than, e.g., that of silicon dioxide, is preferable. A gate dielectric layer 112 having an exemplary thickness of about 1.7 nm is formed over the ILD 110 and the channel region 108. The gate dielectric layer 112 may be formed from any appropriate dielectric, though a high-k dielectric, such as hafnium dioxide, hafnium silicate, zirconium dioxide, and zirconium silicate.

A sacrificial stressor metal layer 114 is formed over the gate dielectric layer 112. The stressor metal 114 can be formed from, e.g., titanium nitride or tantalum nitride. The stress level of the end product can be modulated by changing the stressor metal 114. The stress level may further be increased by using a highly compressive titanium nitride film. The stressor metal layer 114 may be formed using any appropriate process including, e.g., physical vapor deposition, atomic layer deposition, and chemical vapor deposition. Furthermore, a wide range of thicknesses for the stressor metal layer 114 may be employed. For example, thicknesses between about 25-140 angstroms have been shown to produce an effective stress level.

Titanium nitride has a compressive strain of about 2 GPa. This strain can be increased up to about 3.6 GPa. To produce highly stressed titanium nitride, a thin titanium layer is deposited (e.g., about 15-100 angstroms by physical vapor deposition) and then nitridized with a nitrogen plasma to form a titanium nitride film. The molar volume of titanium (10.6 $cm^3$/mol) increases (to 11.9 $cm^3$/mol), causing a 12% volumetric strain associated with the transition. Tantalum nitride, meanwhile has a strain of about 1 GPa and is suitable for p-type FETs.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
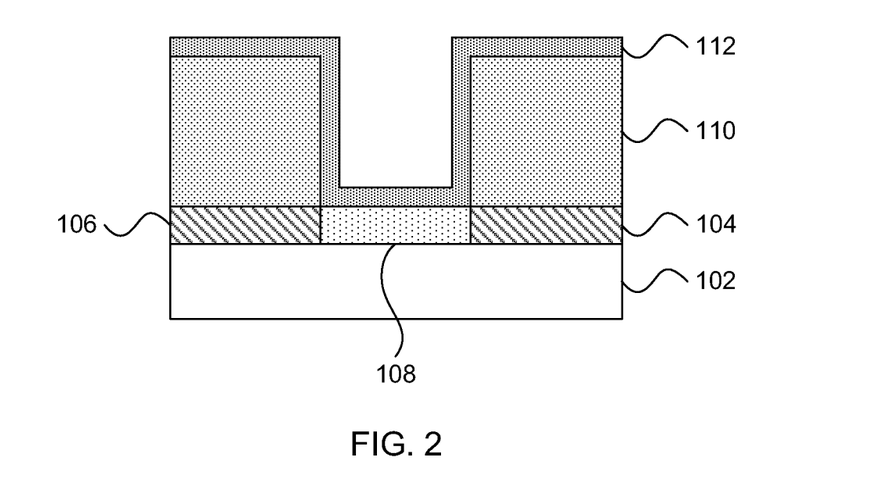
FIG. 2 is a cross-sectional view of a step in creating a memorized-stress RMG FinFET in accordance with the present principles.

Referring now to FIG. 2, a further step in creating a memorized-stress RMG FinFET is shown. The sacrificial metal stressor layer 114 has been removed, exposing the gate dielectric layer 112. The metal stressor layer may be removed by any appropriate process, including for example a wet etch using, e.g., a solution of ammonium hydroxide, hydrogen peroxide, and water. The stress caused by the metal stressor layer 114 is memorized by the channel region 108 and remains after the stressor layer 114 is removed.

Figure 3:
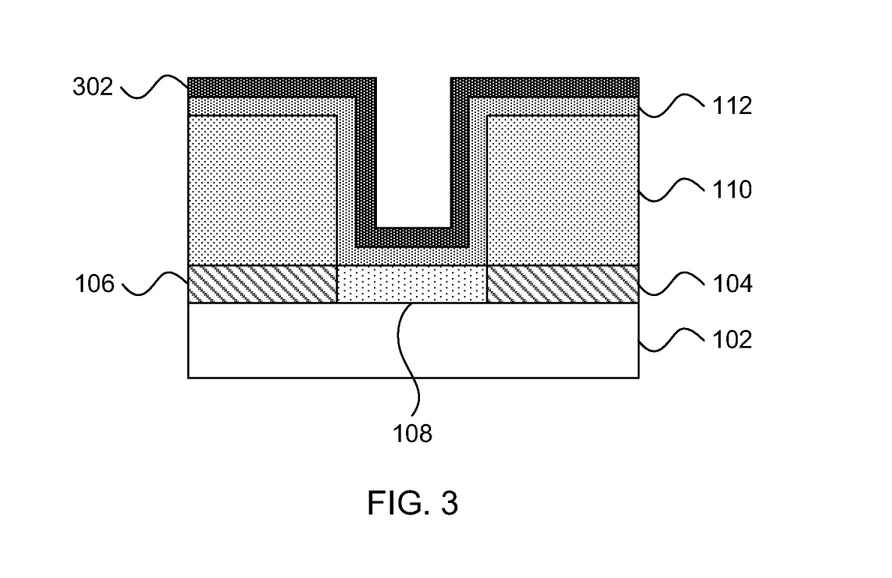
FIG. 3 is a cross-sectional view of a step in creating a memorized-stress RMG FinFET in accordance with the present principles.

Referring now to FIG. 3, a further step in creating a memorized-stress RMG FinFET is shown. A work function metal layer 302 is deposited on the gate dielectric layer 112. The work function metal can be titanium nitride having a different percentage of nitrogen relative to the metal stressor layer 114, tantalum nitride, tantalum carbide, titanium carbide, etc. Processing proceeds from this point as normal—as long as there are no high-temperature processes after this point, the memorized stress will remain. For this reason, it is helpful to make the gate last.

Figure 4:
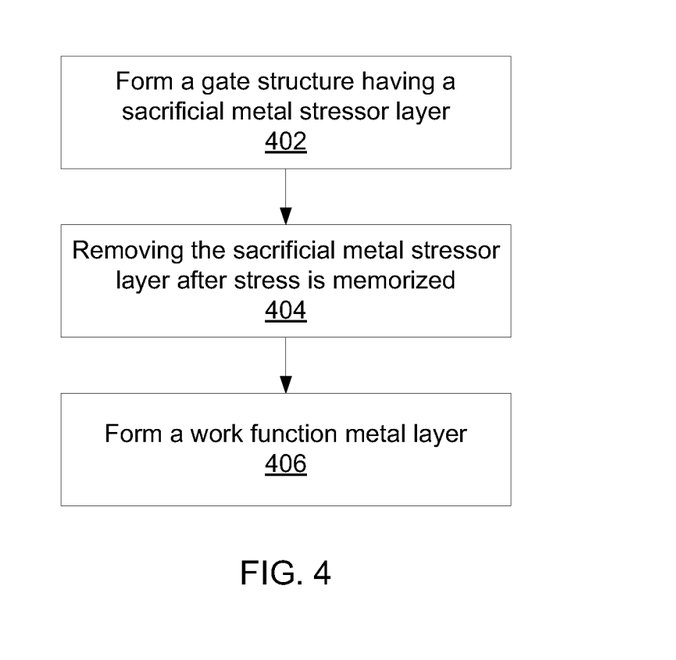
FIG. 4 is a block/flow diagram of a method for creating a memorized-stress RMG FinFET in accordance with the present principles.

Referring now to FIG. 4, a method of forming memorizing stress in an RMG FinFET is shown. Block 402 forms a gate structure that has a sacrificial metal layer 114. The sacrificial metal layer 114 is selected to provide a stress on the nearby materials, including channel region 108. Block 404 removes the sacrificial metal layer 114 after the stress has been memorized in the nearby materials, allowing block 406 to form a work function metal layer 302 in the place of the metal stressor layer 114. This allows the use of metals that have a work function that is appropriate for, e.g., n-type FETs. Combining this process flow with the creation of p-type FETs on the same chip may involve additional steps, as the stressor metal layer may be retained in a p-type FET.

Figure 5:
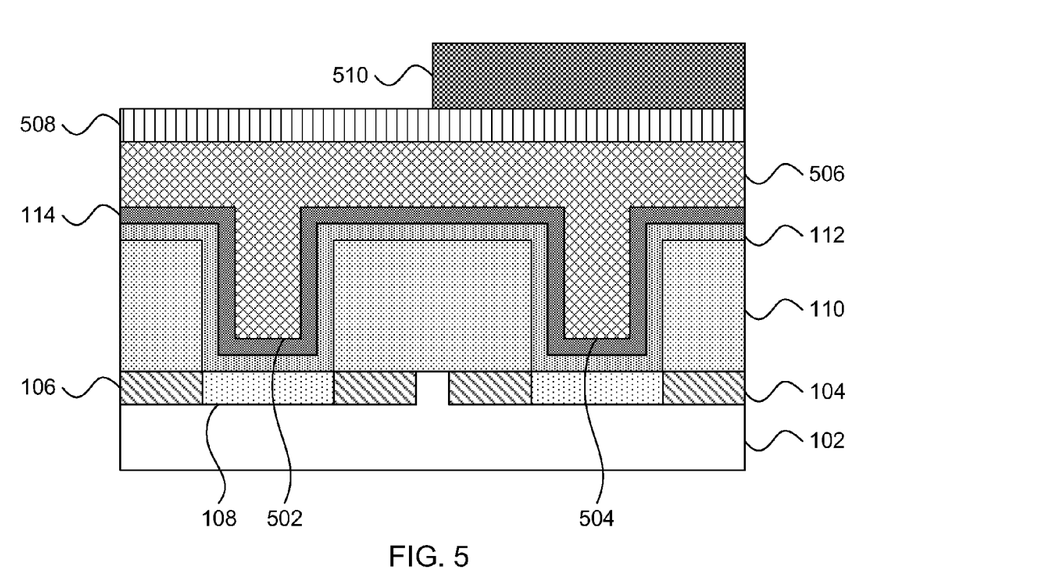
FIG. 5 is a cross-sectional view of a step in creating a memorized-stress RMG n-type FinFET on the same chip as p-type FinFETs in accordance with the present principles.

Referring now to FIG. 5, a step in creating a memorized-stress RMG n-type FinFET on the same chip as p-type FinFETs is shown. The process begins in the same way for n-type region 502 and p-type region 504. As above, source/drain and channel regions 104, 106, and 108 are formed on a semiconductor or a semiconductor-on-insulator substrate 102. These regions will be doped or undoped according to the transistor type, with exemplary semiconductors including silicon, germanium, and binary compound semiconductors, such as gallium arsenide and exemplary dopants including phosphorus, arsenic, and boron.

The gate dielectric layer 112 extends over both the n-type region 502 and the p-type region 504 and has an exemplary thickness of about 1.7 nm. The gate dielectric layer 112 may be formed from any appropriate dielectric, though a high-k dielectric, such as hafnium dioxide, hafnium silicate, zirconium dioxide, and zirconium silicate. A metal stressor layer 114 is formed over the gate dielectric layer 112 for both regions 502 and 504 with an exemplary thickness of 2.5-14 nm. The stressor metal 114 can be formed from, e.g., titanium nitride or tantalum nitride. The stressor metal 114 in this case should provide sufficient stress for the two regions 502 and 504, but it should also have a work function suitable for use in the p-type FET 504.

An organic planarization layer (OPL) 506 having an exemplary thickness of about 100 nm is formed over the metal stressor layer 114 and may include an appropriate organic polymer. An anti-reflective coating (ARC) 508 having an exemplary thickness of about 15-18 nm is applied to the OPL 506 and may include, e.g., a titanium anti-reflective coating. A photoresist layer 510 is formed over the ARC 508 on the side of the p-type region 504 with an exemplary thickness of about 60-70 nm.

Figure 6:
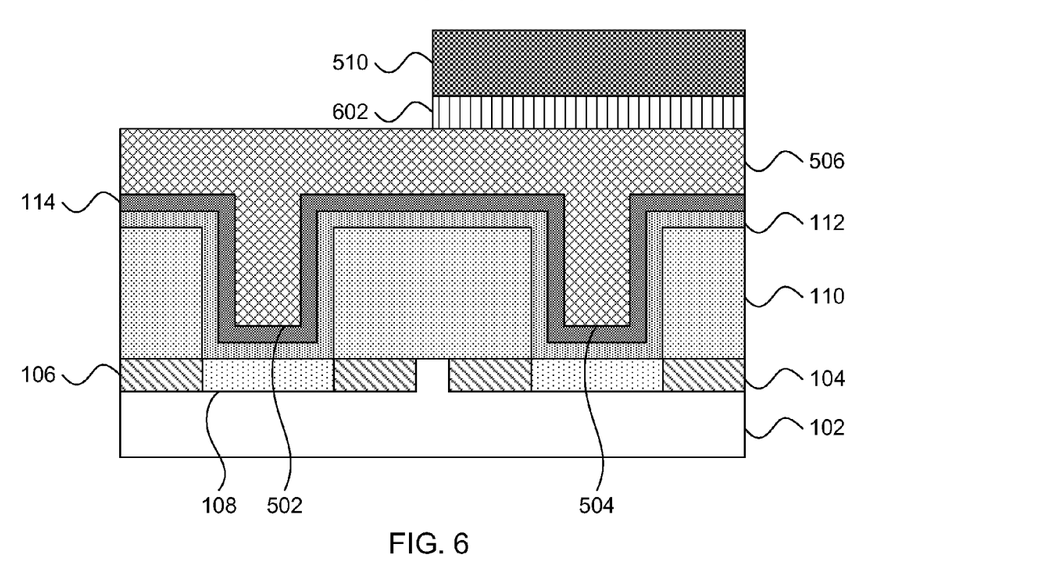
FIG. 6 is a cross-sectional view of a step in creating a memorized-stress RMG n-type FinFET on the same chip as p-type FinFETs in accordance with the present principles.

Referring now to FIG. 6, a further step in creating a memorized-stress RMG n-type FinFET on the same chip as p-type FinFETs is shown. The ARC layer 508 is removed over the n-type region 502 using, e.g., an e-beam lithography process that stops on the OPL 506. This leaves an etched ARC layer 602 only over the p-type region 504.

Figure 7:
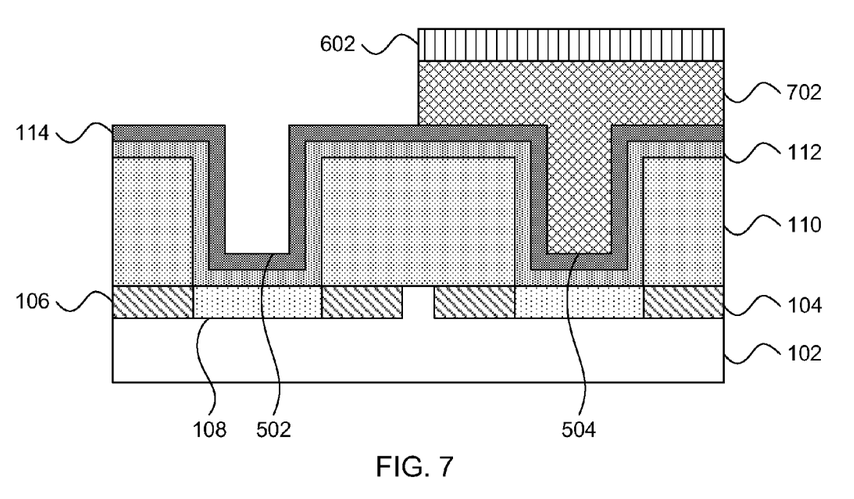
FIG. 7 is a cross-sectional view of a step in creating a memorized-stress RMG n-type FinFET on the same chip as p-type FinFETs in accordance with the present principles.

Referring now to FIG. 7, a further step in creating a memorized-stress RMG n-type FinFET on the same chip as p-type FinFETs is shown. The OPL 506 is etched to expose the metal layer 114 over the n-type region 502, leaving etched OPL 702 over the p-type region 504.

Figure 8:
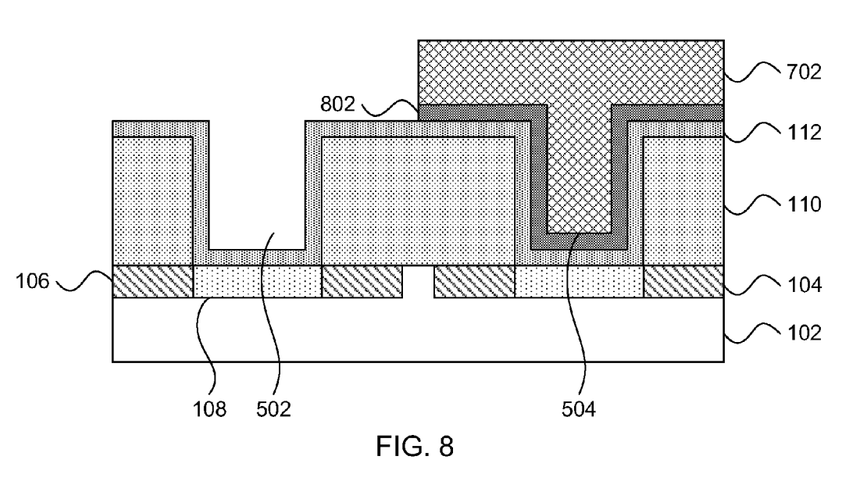
FIG. 8 is a cross-sectional view of a step in creating a memorized-stress RMG n-type FinFET on the same chip as p-type FinFETs in accordance with the present principles.

Referring now to FIG. 8, a further step in creating a memorized-stress RMG n-type FinFET on the same chip as p-type FinFETs is shown. The sacrificial metal stressor layer 114 is been removed over the n-type region 502, exposing the gate dielectric layer 112 there. The metal stressor layer may be removed by any appropriate process, including for example a wet etch using, e.g., a solution of ammonium hydroxide, hydrogen peroxide, and water. The stress caused by the metal stressor layer 114 is memorized by the channel region 108 and remains after the stressor layer 114 is removed. The remaining metal stressor layer 802 continues to provide active stress to the channel material 108 of the p-type region 804.

Figure 9:
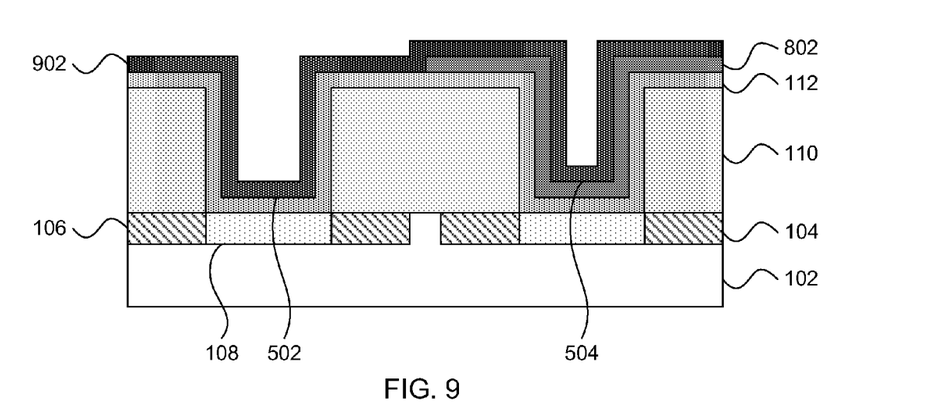
FIG. 9 is a cross-sectional view of a step in creating a memorized-stress RMG n-type FinFET on the same chip as p-type FinFETs in accordance with the present principles.

Referring now to FIG. 9, a further step in creating a memorized-stress RMG n-type FinFET on the same chip as p-type FinFETs is shown. A work function metal layer 902 is formed over the n-type region 502 and p-type region 504. The work function metal is selected in particular to suit the needs of an n-type transistor, as the remaining stressor metal layer 802 over the p-type region 504 already has a suitable work function for a p-type transistor. It should be recognized that the layer of work function metal 902 does not interfere with the remaining metal stressor layer 802. Therefore, the work function layer 902 may be applied uniformly, simplifying the manufacturing process. The workfunction is set by the metal closest to the gate dielectric 112 and the channel 108—anything above will be screened. The work function metal layer 902 may be formed according to any appropriate process, including chemical vapor deposition, physical vapor deposition, and atomic layer deposition, and need not fill the entire space of the transistor gate. In future manufacturing processes, as feature sizes decrease, the metal stressor layer 902 may completely fill the gate region for the transistors.

Figure 10:
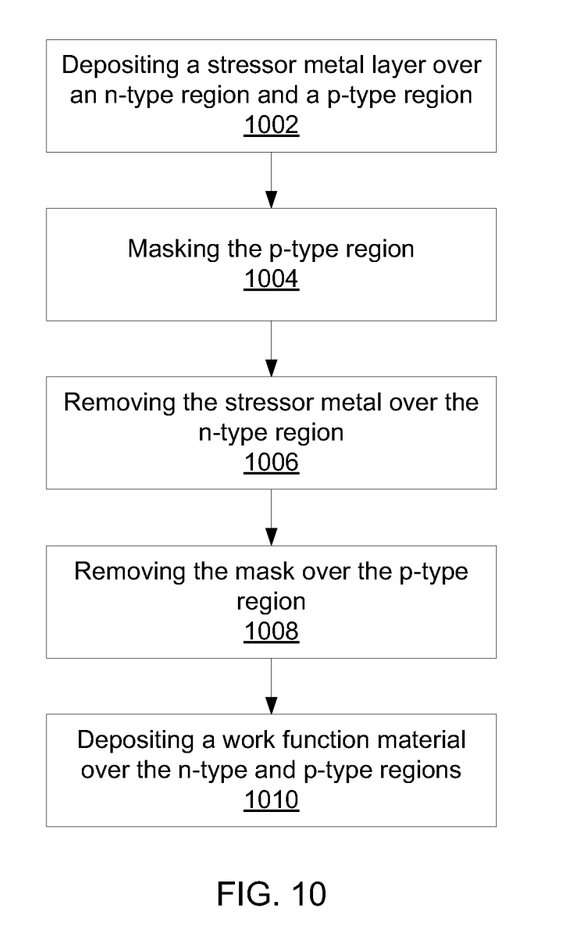
FIG. 10 is a block/flow diagram of a method for creating a memorized-stress RMG n-type FinFET on the same chip as p-type FinFETs in accordance with the present principles.

Referring now to FIG. 10, a method for forming n-type transistors and p-type transistors on the same chip is shown. Block 1002 deposits a stressor metal layer 114 over an n-type region 502 and a p-type region 504. As noted above, the stressor metal layer 114 provides a stress to the surrounding materials that is memorized in the materials. Block 1004 masks the p-type region 504 using, e.g., an OPL 702, an ARC 602, and a photoresist 510. This may be performed by depositing an OPL 506 and ARC 508 and using lithography to remove the material that is over the n-type region 502.

Block 1006 removes the stressor metal 114 from the n-type region 502. The remaining stressor metal 802 remains over the p-type region 504, as it is still suitable for use as a work function metal in such devices. Block 1008 removes the mask over the p-type region 506, exposing the remaining stressor metal 802. Block 1010 then deposits a work function metal layer 902 over both regions 502 and 504 using, e.g., chemical vapor deposition, atomic layer deposition, or physical vapor deposition. After this block 1010, processing proceeds normally. It should be recognized that no annealing step should take place after stress memorization, as the heat will wipe out the stress memory. As such, embodiments of the present should be incorporated into process flows that form the gate after any high-temperature steps.

Having described preferred embodiments of stress memorization in RMG FinFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming transistors with memorized stress, comprising: forming a first transistor and a second transistor structure, each having a channel region, a source and drain region, and a gate dielectric; depositing a stressor metal over the channel regions of the first mid second transistor structures, wherein the stressor metal provides a stress to the channel regions; masking the second transistor structure; removing the stressor metal from the first transistor structure after the stress is memorized within the channel region of the first transistor structure; removing the mask from the second transistor structure; and depositing a work function metal over the channel region of the first and second transistor structures, where the work function metal applies less stress to the channel region than the stress applied by the stressor metal and wherein the work function metal is layered over the stressor metal on the second transistor structure.

2. The method of claim 1, wherein the stressor metal undergoes a compressive stress that pulls the respective channel regions.

3. The method of claim 2, wherein the internal structure of the respective channel regions changes in response to the pull of the stressor metal, memorizing the stress in the channel regions.

4. The method of claim 1, wherein the transistor structures are replacement metal gate structures having a recessed channel region.

5. The method of claim 1, wherein the work function metal forms a layer that leaves a gap between sidewalls of the respective transistor structures.

6. The method of claim 1, wherein the first transistor structure has source, drain, and channel regions that are doped according to an n-type structure and the second transistor structure has source, drain, and channel regions that are doped according to a p-type structure.

7. The method of claim 1, wherein the stressor metal is selected from a group consisting of titanium nitride and tantalum nitride.

8. The method of claim 7, wherein the stressor metal is a layer of highly compressive titanium nitride.

\* \* \* \* \*